(12) United States Patent
Shokouhi et al.

(10) Patent No.: US 6,525,973 B1
(45) Date of Patent: Feb. 25, 2003

(54) AUTOMATIC BITLINE-LATCH LOADING FOR FLASH PROM TEST

(75) Inventors: Farshid Shokouhi, San Jose, CA (US); Michael G. Ahrens, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/020,536

(22) Filed: Dec. 12, 2001

(51) Int. Cl.[7] .................................................. G11C 7/00
(52) U.S. Cl. .............................. 365/189.12; 365/189.11; 365/78
(58) Field of Search ............................. 365/189.12, 78, 365/201, 189.11, 190; 326/39; 377/29

(56) References Cited

U.S. PATENT DOCUMENTS

| | | | | |
|---|---|---|---|---|
| 4,388,698 A | * | 6/1983 | Allen | 365/78 |
| 5,282,164 A | * | 1/1994 | Kawana | 326/39 |
| 5,526,390 A | * | 6/1996 | Fucili | 377/29 |
| 5,742,531 A | | 4/1998 | Freidin et al. | |
| 6,137,307 A | | 10/2000 | Iwanczuk et al. | |

* cited by examiner

*Primary Examiner*—David Lam
(74) *Attorney, Agent, or Firm*—John Kubodera; Edel M. Young

(57) ABSTRACT

A one-shot system for loading a bitline shift register with a typical test pattern is described. Each bitline latch within the bitline shift register is augmented with a one-shot circuit that may pull-up or pull-down the value stored in the bitline latch. The choice of a particular memory test pattern dictates the control of the one-shot circuit.

24 Claims, 5 Drawing Sheets

AUTOMATIC BITLINE-LATCH LOADING FOR FLASH PROM TEST

FIELD OF THE INVENTION

The present invention relates to memory array testing, and more particularly to a system and method for quickly loading test patterns into a memory array.

BACKGROUND OF THE INVENTION

Many kinds of chips include memory on the chip. Prior to shipping these chips, this memory needs to be tested. Typically, each memory cell is programmed with a first data bit (e.g. a logic "1" value), then that data bit is read from the memory cell, then each memory cell is programmed with the opposite data bit (e.g. a logic "0" value), and then that data bit is read. In this way, the ability of each cell in the memory array to store logic "1" values and logic "0" values is verified.

There are several common test patterns that are typically used to test memory arrays. A test pattern is a particular sequence of logic "1" values and logic "0" values. For example, a checkerboard test pattern for an 8×8 memory array would have alternating logic "1" values and logic "0" values, for example, as shown in Table 1:

TABLE 1

| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |

Conventionally, the data for this checkerboard pattern is programmed into a row of a memory array after being serially shifted into a bitline shift register. Memory arrays may be quite large, for example, 4096 rows and columns of memory cells supported by a 4096 latch bitline shift register. For a 4096 cell memory array, this conventional programming method requires 4096 data shifts to load the bitline shift register before each row of the memory array may be loaded. This lengthy delay in loading each row of a test pattern is repeated for each row of the memory array, adding undesirable delay in the memory testing process.

FIG. 1 is a block diagram of a conventional memory system 100. Memory system 100 includes a four-latch bitline shift register 110 and a 4×3 cell memory array 120. Bitline shift register 110 includes a bitline latch L0, a bitline latch L1, a bitline latch L2, and a bitline latch L3. Data QIN applied to bitline shift register 110 is serially shifted through bitline latches L0–L3. When bitline latches L0–L3 store appropriate data, that data is stored in a row of memory array 120. Memory array 120 includes three rows of memory cells, each row controlled by one of row lines RL0–RL2. Each row of memory cells includes four memory cells. For example, row 1 of memory array 120, which is controlled by row line RL1, includes memory cells M10, M11, M12, and M13.

A checkerboard test pattern is conventionally applied to memory array 120 in the following manner. A logic "0" value is applied to bitline shift register 110 and shifted into bitline latch L0 as data Q0. A logic "1" value is then applied to bitline shift register 110. When the logic "1" value is shifted into bitline latch L0 as data Q0, the former logic "0" value of data Q0 is shifted into bitline latch L1 as data Q1. Next, a logic "0" value is applied to bitline shift register 110. When the logic "0" value is shifted into bitline latch L0 as data Q0, the former logic "1" value of data Q0 is shifted into bitline latch L1 as data Q1 and the former logic "0" value of data Q1 is shifted into bitline latch L2 as data Q2. Again, a logic "1" value is applied to bitline shift register 110. When the logic "1" value is shifted into bitline latch L0 as data Q0, the former logic "0" value of data Q0 is shifted into bitline latch L1 as data Q1, the former logic "1" value of data Q1 is shifted into bitline latch L2 as data Q2, and the former logic "0" value of data Q2 is shifted into bitline latch L3 as data Q3. As a result, bitline shift register 110 stores a data pattern of "1, 0, 1, 0", as data Q0, Q1, Q2, and Q3. Row line RL2 is enabled to write this data into memory cells M20, M21, M22, and M23, respectively.

As described above, four clock cycles are required to load four-latch bitline shift register 110 with a row of data for a checkerboard pattern prior to storing that data in a row of memory array 120. Shift register 110 must then be loaded with the inverse pattern (e.g., a data pattern of "0, 1, 0, 1" as data Q0, Q1, Q2, and Q3), taking another four clock cycles. This new data pattern is written into memory cells M10, M11, M12, and M13, respectively, by enabling row line RL1. Then the original pattern is re-loaded into bitline shift register 110 and store in memory cells M00, M01, M02, and M03. As a result, in addition to the clock cycles required to load each row of memory array 120, twelve clock cycles are needed to load bitline shift register 110. Considering a typical memory array of 4096 memory cells per row, the time required to load memory array 120 becomes a very time-consuming process.

It would be desirable to store rows of test pattern data in bitline shift register 110 in one shot to reduce the delays occurring during memory arrays testing.

SUMMARY

Accordingly, a system for testing a memory array is described that allows common memory test patterns to be loaded into a bitline shift register in one shot. In one embodiment of the present invention, a one-shot circuit including a pull-up transistor and a pull-down transistor is added to each bitline latch in the bitline shift register. The desired test pattern may be defined in software, which defines the pull-up and pull-down characteristics of the one-shot circuit for each bitline latch. During normal operation, the one-shot circuit does not affect the serial shifting of data through the bitline shift register. However, during loading of programmed memory test pattern data, the one-shot circuit allows all bitline latches within the bitline shift register to be loaded in parallel. This parallel loading of the bitline latches requires only one clock cycle, as opposed to N clock cycles for conventionally shifting a test pattern into an N-latch-wide conventional bitline shift register. For an N-row memory array, this time savings occurs for every row loaded with one-shot stored data. Consequently, the time required to load each row of the memory array is dramatically decreased.

The present invention will be more fully understood in view of the following description and drawings.

BRIEF DESCRIPTION OF THE DRAWINGS

Similar elements in Figures are labeled similarly.

DETAILED DESCRIPTION

A one-shot circuit is added to each bitline latch in a bitline shift register of a memory system. A one-shot circuit is a circuit that allows direct loading of a data value into the bitline latch, such that a plurality of bitline latches coupled in series may be loaded with data values in parallel. The one-shot circuit is coupled to one or more control lines to define the data to be loaded onto the bitline latch. During normal operation, this one-shot circuit does not affect the serial shifting of data through the bitline shift register. However, when loading a typical test pattern, the one-shot circuits load their associated bitline latches with pre-defined test pattern data according to the control lines. The operation of the bitline shift register may be changed from normal to one-shot in the software used to control the operation of the memory system.

Figure 2:
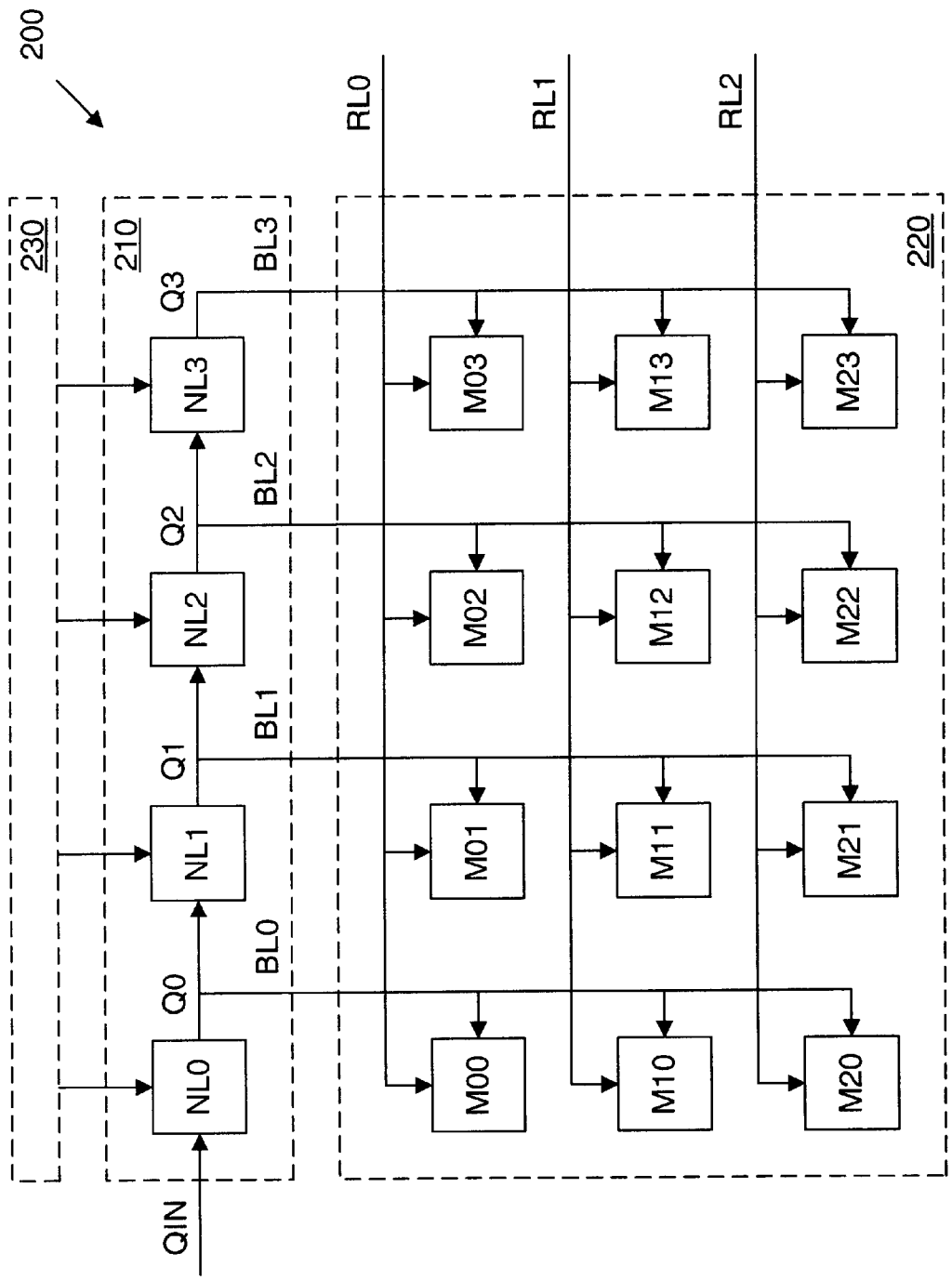
FIG. 2 is a block diagram of a memory system in accordance with one embodiment of the present invention.

FIG. 2 is a block diagram of a memory system 200 in accordance with one embodiment of the present invention. Memory system 200 includes a four-latch bitline shift register 210, a 4×3 memory array 220, and a logic generator 230. Bitline shift register 210 includes a configurable latch NL0, a configurable latch NL1, a configurable latch NL2, and a configurable latch NL3. Data QIN applied to bitline shift register 210 is serially shifted through bitline latches NL0–NL3. When bitline latches NL0–NL3 store the appropriate data, that data is stored in a row of memory cells in memory array 220. Memory array 220 includes three rows of memory cells, each row controlled by one of row lines RL0–RL2. Each row of memory cells includes four memory cells. For example, row 1 of memory array 220, which is controlled by row line RL1, includes memory cells M10, M11, M12, and M13. While memory system 200 is described with four columns of configurable latches and memory cells and three rows of memory cells, the principles of the present invention may be extended to a memory system having any number of rows and columns. For example, one variation of memory system 200 includes 4096 bitline latches in bitline shift register 210, and 4096 rows and columns of memory array 220.

Figure 1:
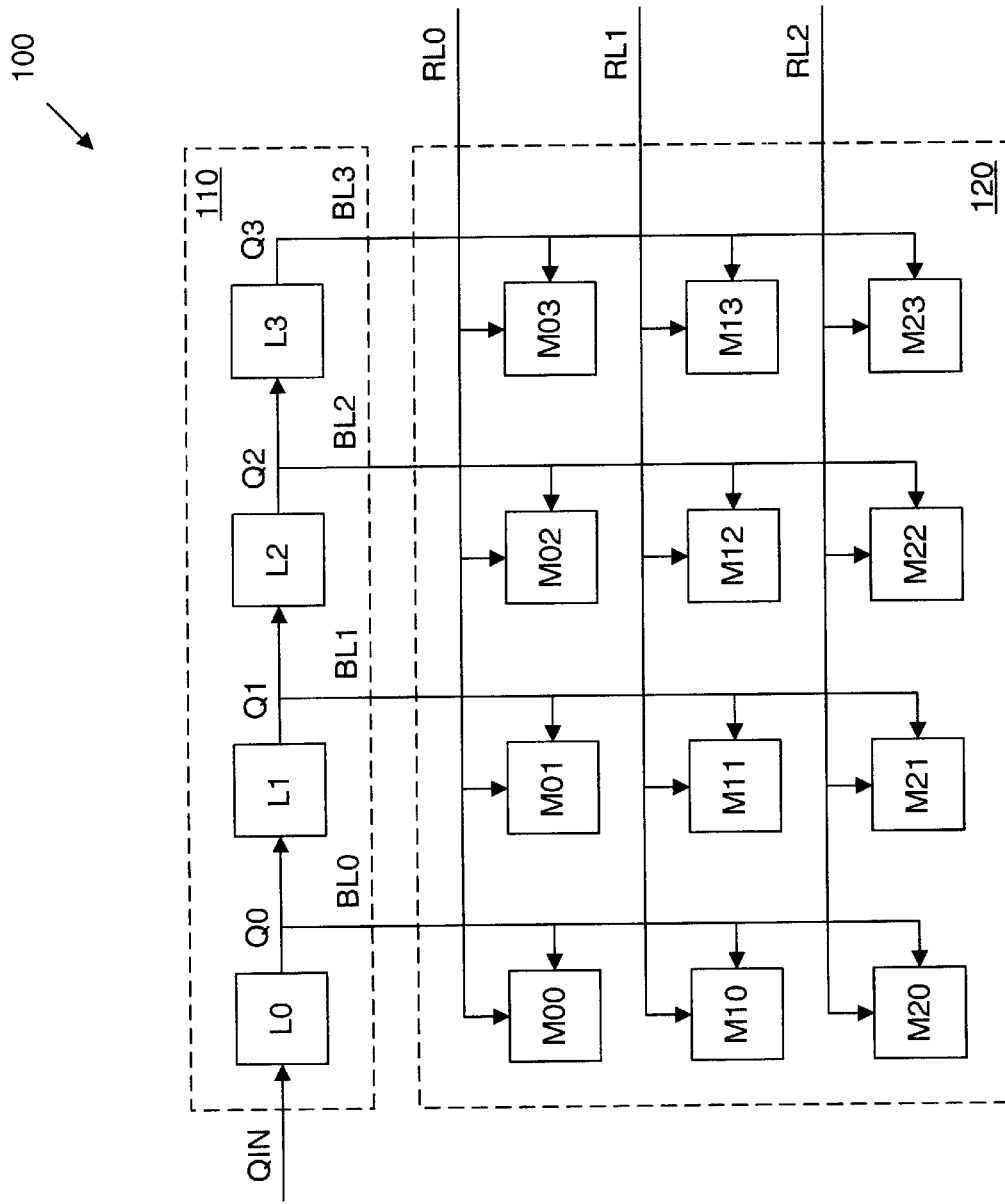
FIG. 1 is a block diagram of a conventional memory system.

By incorporating a one-shot circuit into conventional bitline latches, bitline shift register 210 may function either normally, similarly to conventional memory system 100 (FIG. 1), or as a one-shot data loader according to the principles of the present invention. Logic generator 230 provides a logic "1" value and a logic "0" value, which may be coupled to appropriate logic within configurable latches NL0–NL3 to control the one-shot circuit. The one-shot operation is described in more detail below.

Typical test patterns for memory arrays include a checkerboard pattern (as described above) and alternating rows of logic "1" values and logic "0" values. In one embodiment, pre-defined test patterns may be defined in software using a specific command, for example a JTAG command (conforming to a standard defined by the Joint Test Action Group). Some JTAG commands may include "FONES" (fills a bitline shift register with all logic "1" values), "FZEROES" (fills a bitline shift register with all logic "0" values, "FCHBD" (fills a bitline shift register with alternating logic "1" values and logic "0" values, with a logic "0" value in the left-most position), and "FCHBDB" (fills a bitline shift register with alternating logic values and logic "0" values, with a logic "1" value in the left-most position). For example, to generate a row of a checkerboard pattern beginning with a logic "0" value, a FCHBD command may be issued, resulting in the parallel loading (i.e. the one-shot loading) of bitline shift register 210 with the appropriate pattern. Similarly, to generate a row of the checkerboard pattern beginning with a logic "1" value, a FCHBDB command may be issued, resulting in the one-shot load of bitline shift register 310. By alternating the FCHBD and FCHBDB commands in between commands to write the data stored in bitline shift register 210 to rows of memory array 220, a checkerboard pattern is programmed into memory array 220. Table 2 contains an example command sequence for loading an eight row and eight column memory array with a checkerboard pattern.

TABLE 2

| Number | Command | Description |
| --- | --- | --- |
| 1. | RESET | Resets the chip (and memory array) |
| 2. | SET NORM | Enables access to test commands |
| 3. | ISPEN | Enables In-System Programming |
| 4. | FCHBD | Load the checkerboard pattern |
| 5. | FPGM | Program one row of memory |
| 6. | FCHBDB | Load the checkerboard bar pattern |
| 7. | FPGM | Program another one row of memory |
| 8. | FCHBD | Load the checkerboard pattern |
| 9. | FPGM | Program another one row of memory |
| 10. | FCHBDB | Load the checkerboard bar pattern |
| 11. | FPGM | Program another one row of memory |
| 12. | FCHBD | Load the checkerboard pattern |
| 13. | FPGM | Program another one row of memory |
| 14. | FCHBDB | Load the checkerboard bar pattern |
| 15. | FPGM | Program another one row of memory |
| 16. | FCHBD | Load the checkerboard pattern |
| 17. | FPGM | Program another one row of memory |
| 18. | FCHBDB | Load the checkerboard bar pattern |
| 19. | FPGM | Program another one row of memory |
| 20. | RESET | Resets the chip (and memory array) |

Similarly, programming a memory array with alternating rows of ones and zeroes may be accomplished by substituting a FONES command for the FCHBD command and a FZEROS command for the FCHBDB command.

Figure 3A:
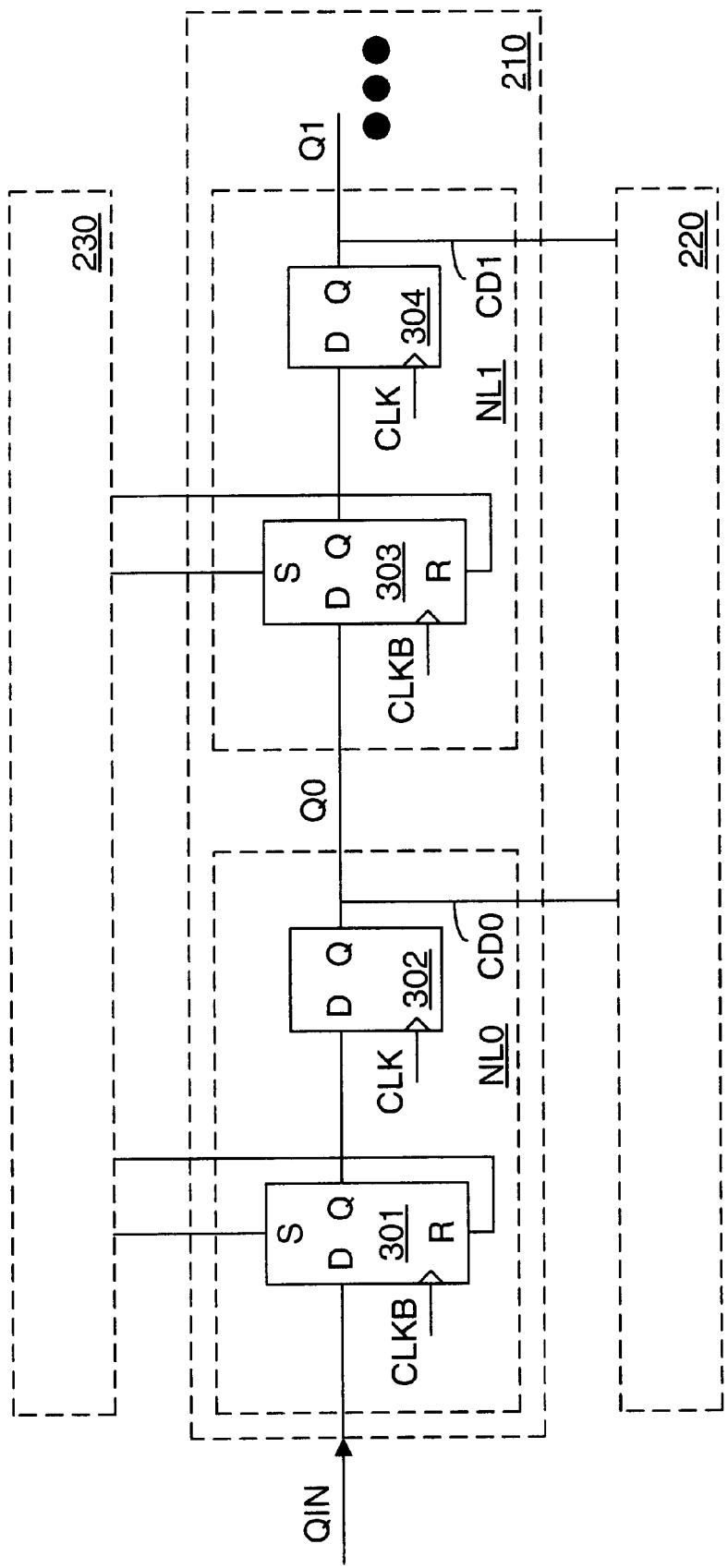
FIG. 3A is a schematic diagram of two configurable latches in accordance with one embodiment of the present invention.

FIG. 3A is a schematic diagram of configurable latches NL0 and NL1 in accordance with one embodiment of the present invention. Configurable latch NL0 includes a set/reset latch 301 and a latch 302. Set/reset latch 301 includes a data input terminal coupled to receive an input data value (e.g. a data value from a serial data stream QIN), a clock terminal coupled to receive an inverted clock signal CLKB, a set terminal and a reset terminal both coupled to logic generator 230, and a data output terminal. Latch 302 includes a data input terminal coupled to the data output terminal of set/reset latch 301 and a data output terminal. An output data value Q0 is provided at the data output terminal of latch 302. Similarly, configurable latch NL1 includes a set/reset latch 303 and a latch 304. Set/reset latch 303 includes a data input terminal coupled to receive an input data value (e.g. data value Q0), a clock terminal coupled to receive a clock signal CLK, a set terminal and a reset terminal both coupled to logic generator 330, and a data output terminal. Latch 304 includes a data input terminal coupled to the data output terminal of set/reset latch 303 and a data output terminal. An output data value Q1 is provided at the data output terminal of latch 304. Other configurable latches in bitline shift register 210 (FIG. 2) may be similarly defined.

As described above, bitline shift register 210 (FIG. 2) may function in one of two ways: normal operation or one-shot data loading. During normal operation, data from a serial data stream QIN is shifted through configurable latches including NL0 and NL1, and then stored in memory array 220 when bitline shift register 210 is full. A clock signal CLK and an inverse clock signal CLKB control the flow of storage data through configurable latches NL0 and NL1. During one-shot test pattern loading, set/reset latches 301 and 303 are either set or reset, depending on the pattern to be loaded. A set command causes a logic "1" value to be stored in a configurable latch, and a reset command causes a logic "0" to be stored in the configurable latch. Because each configurable latch can be set or reset independently of other configurable latches, this one-shot loading of a test pattern row may occur in parallel. This set/reset operation forces each bitline latch to store a particular data value, which then may be stored in memory array 220 along column data lines CD0 and CD1.

Figure 3B:
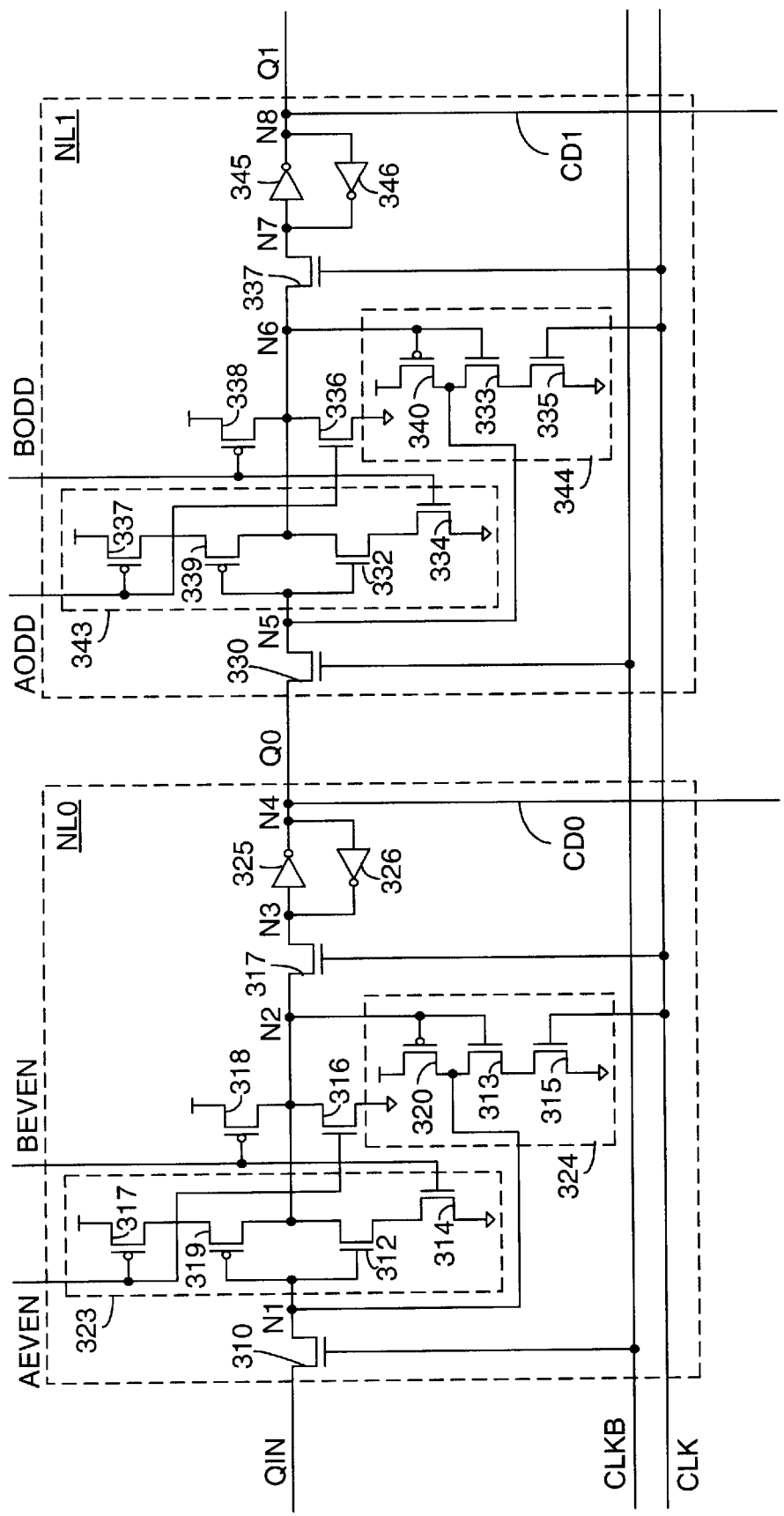
FIG. 3B is a schematic diagram of configurable latches in accordance with another embodiment of the present invention.

FIG. 3B is a schematic diagram of configurable latches NL0 and NL1 in accordance with another embodiment of the present invention. P-channel transistors 317 and 319 are coupled in series with n-channel transistors 312 and 314 to form an inverter 323 having an input node Nl at the gates of transistors 312 and 319 and an output node N2 at a source/drain terminal of transistors 312 and 319. Pull-up p-channel transistor 318 is coupled in series with pull-down n-channel transistor 316 between the $V_{cc}$ supply voltage and ground. A source/drain terminal of transistors 316 and 318 is coupled to node N2. A data line AEVEN is coupled to a gate of transistor 317 and transistor 316. A data line BEVEN is coupled to a gate of transistor 314 and transistor 318. Transistors 314, 316, 317, and 318 form a one-shot circuit. Data lines AEVEN and BEVEN are used to control the one-shot operation of this one-shot circuit. An inverted clock signal CLKB controls an access transistor 310, which passes a data value from a serial data stream QIN to node N1. P-channel transistor 320 and n-channel transistors 313 and 315 are coupled between the $V_{cc}$ supply voltage and ground to form another inverter 324 having an input node N2 at the gates of transistors 320 and 313 and an output node N1 at a source/drain terminal of transistors 320 and 313. Thus, inverters 323 and 324 are coupled as feedback inverters, forming a storage latch with nodes N1 and N2.

A clock signal CLK controls another access transistor 317, which passes the data value stored at node N2 to a node N3. Inverter 325 is coupled with inverter 326 between nodes N3 and N4, forming another storage latch. A first data value Q0 is stored at node N4. Column data line CD0 is coupled to configurable latch NL1 at node N4, and provides data to a first column of memory cells in memory array 220 (FIG. 2).

Similarly to configurable latch NL0, configurable latch NL1 includes a first inverter 343 including p-channel transistors 337 and 339 coupled in series with n-channel transistors 332 and 334 between the $V_{cc}$ voltage supply source and ground. Inverter 343 has an input node N5 at a gate of transistor 339 and transistor 332 and an output node N6 at a source/drain terminal of transistor 332 and transistor 339. Pull-up p-channel transistor 338 is coupled in series with pull-down n-channel transistor 336 between the VcC supply voltage and ground. A source/drain terminal of transistors 336 and 338 is coupled to node N6. A data line AODD is coupled to a gate of transistor 337 and transistor 336. A data line BODD is coupled to a gate of transistor 334 and transistor 338. Transistors 334, 336, 337, and 338 form another one-shot circuit. Data lines AODD and BODD are used to control the one-shot operation of this one-shot circuit. The inverted clock signal CLKB controls an access transistor 330, which passes the data value Q0 from configurable latch NL0 to node N5. P-channel transistor 340 and n-channel transistors 333 and 335 are coupled between the $V_{cc}$ supply voltage and ground to form another inverter 344 having an input node N6 at the gates of transistors 340 and 333 and an output node N5 at a source/drain terminal of transistors 340 and 333. Thus, inverters 343 and 344 are coupled as feedback inverters, forming a storage latch with nodes N5 and N6.

The clock signal CLK controls another access transistor 337, which passes the data value stored at node N6 to a node N7. Inverter 345 is coupled with inverter 346 to form another storage latch between nodes N7 and N8. A second data value Q1 is stored at node N8. Column data line CD1 is coupled to configurable latch NL1 at node N8, and provides data to a second column of memory cells in memory array 220 (FIG. 2).

In one embodiment, memory array 220 includes non-volatile transistors and the storage latch formed by inverters 325 and 326 is capable of passing the programming voltage to memory array 220. Other configurable latches in bitline shift register 210 are similarly constructed. Each odd-numbered bitline latch has a one-shot circuit coupled to data line AODD and BODD, and each even-numbered bitline latch has a one-shot circuit coupled to data lines AEVEN and BEVEN. This configuration of data lines with alternating one-shot circuits enables both constant value test patterns (such as all ones) and alternating value test patterns (such as a checkerboard) to be one-shot loaded into bitline shift register 210. Other embodiments use other configurations of data lines to support other test patterns.

During normal operation, data lines AEVEN and AODD are held to logic "0" values and data lines BEVEN and BODD are held to logic "1" values. The logic "0" value of data line AEVEN causes transistor 317 to turn on and transistor 316 to turn off, and the logic "1" value of data line BEVEN causes transistor 314 to turn on and transistor 318 to turn off. Similarly, the logic "0" value of data line AODD causes transistor 337 to turn on and transistor 336 to turn off, and the logic "1" value of data line BODD causes transistor 334 to turn on and transistor 338 to turn off. As a result, inverters 323 and 343 function normally, and no pull-up or pull-down occurs through transistors 316, 318, 336, and 338. Thus, data values from serial data stream QIN may be shifted through bitline shift register 210 (FIG. 2) for storage in a row of a memory array as described above.

During one-shot test pattern loading of bitline shift register 210 (FIG. 2), data lines AEVEN, AODD, BEVEN, and BODD are coupled to receive logic values from logic generator 230 (FIG. 2) according to the desired test pattern row. For example, for a checkerboard pattern (FCHBD command), logic generator 230 applies a logic "0" value to data lines AEVEN and BEVEN and a logic "1" value to data lines AODD and BODD. Thus configurable latch NL0 first stores a logic "0" value while configurable latch NL1 stores a logic "1" value. Similarly, other even-labeled configurable latches in bitline shift register 210 (e.g. configurable latch NL2) store logic "0" values and other odd-labeled configurable latches in bitline shift register 210 (e.g. configurable latch NL3) store logic "1" values. These values may be stored in bitline shift register 210 after only one clock cycle. The data stored in bitline shift register 210 is then written to a row of memory array 220 (FIG. 2), and then the opposite test pattern row (e.g. a FCHBDB command) loaded in bitline shift register 210.

Specifically, a checkerboard command (FCHBD) is issued to cause a one-shot loading operation of a logic "0" value to configurable latch NL0 and a logic "1" value to configurable latch NL1. Thus, logic generator 230 (FIG. 2) applies a logic "0" value to data lines AEVEN and BEVEN and a logic "1" value to data lines AODD and BODD. The logic "0" value of data line BEVEN turns on transistor 318, pulling node N2 up to a logic "1" value, while the logic "0" value of data line AEVEN turns off transistor 316. When the clock signal CLK has a logic "1" value, transistor 317 turns on to apply the logic "1" value stored at node N2 to node N3. Inverter 325 inverts this value to store a logic "0" value at node N4, and provides this logic "0" value as data value Q0. The logic "1" value of data line AODD turns on transistor 336, pulling node N6 down to a logic "0" value, while the logic "1" value of data line BODD turns off transistor 338. When the clock signal CLK has a logic "1" value, transistor 337 turns on to apply the logic "0" stored at node N6 to node N7. Inverter 345 inverts this logic "0" value to store a logic "1" value at node N8, and provides this logic "1" value as data value Q1. In this embodiment, each configurable latch in bitline shift register 210 is similarly loaded. This data may then be written along column data lines CD0 and CD1 to a row of memory array 220.

Next, a checkerboard bar command (FCHBDB) is issued to cause a one-shot loading operation of a logic "1" value to configurable latch NL0 and a logic "0" value to configurable latch NL1. Thus, logic generator 230 (FIG. 2) applies a logic "1" value to data lines AEVEN and BEVEN and a logic "0" value to data lines AODD and BODD. The logic "1" value of data line AEVEN turns on transistor 316, pulling node N2 down to a logic "0" value, while the logic "1" value of data line BEVEN turns off transistor 318. When the clock signal CLK has a logic "1" value, transistor 317 turns on to apply the logic "0" value stored at node N2 to node N3. Inverter 325 inverts this value to store a logic "1" value at node N4, and provides this logic "1" value as data value Q0.

The logic "0" value of data line BODD turns on transistor 338, pulling node N6 up to a logic "1" value, while the logic "0" value of data line AODD turns off transistor 336. When the clock signal CLK has a logic "1" value, transistor 337 turns on to apply the logic "1" stored at node N6 to node N7. Inverter 345 inverts this logic "1" value to store a logic "0" value at node N8, and provides this logic "0" value as data value Q1. Again, in this embodiment, each configurable latch in bitline shift register 210 is similarly loaded. This data may then be written along column data lines CD0 and CD1 to another row of memory array 220.

Bitline shift register 210 (FIG. 2) may be repeatedly loaded utilizing alternating checkerboard (FCHBD) and checkerboard bar (FCHBDB) commands, each command resulting in the writing of test data to a row of memory array 220. In one variation of this embodiment, alternating rows of memory array 220 are loaded with the data from one bitline shift register, such that the bitline shift register is only one-shot loaded twice (once with a checkerboard command and once with a checkerboard bar command). While a checkerboard test pattern is described above, other common test patterns may also be pre-programmed. For example, in another embodiment, alternating rows of logic "1" values (a ones command) and logic "0" values (a zeros command) are one-shot loaded into bitline shift register 210 to test memory array 220.

Figure 4:
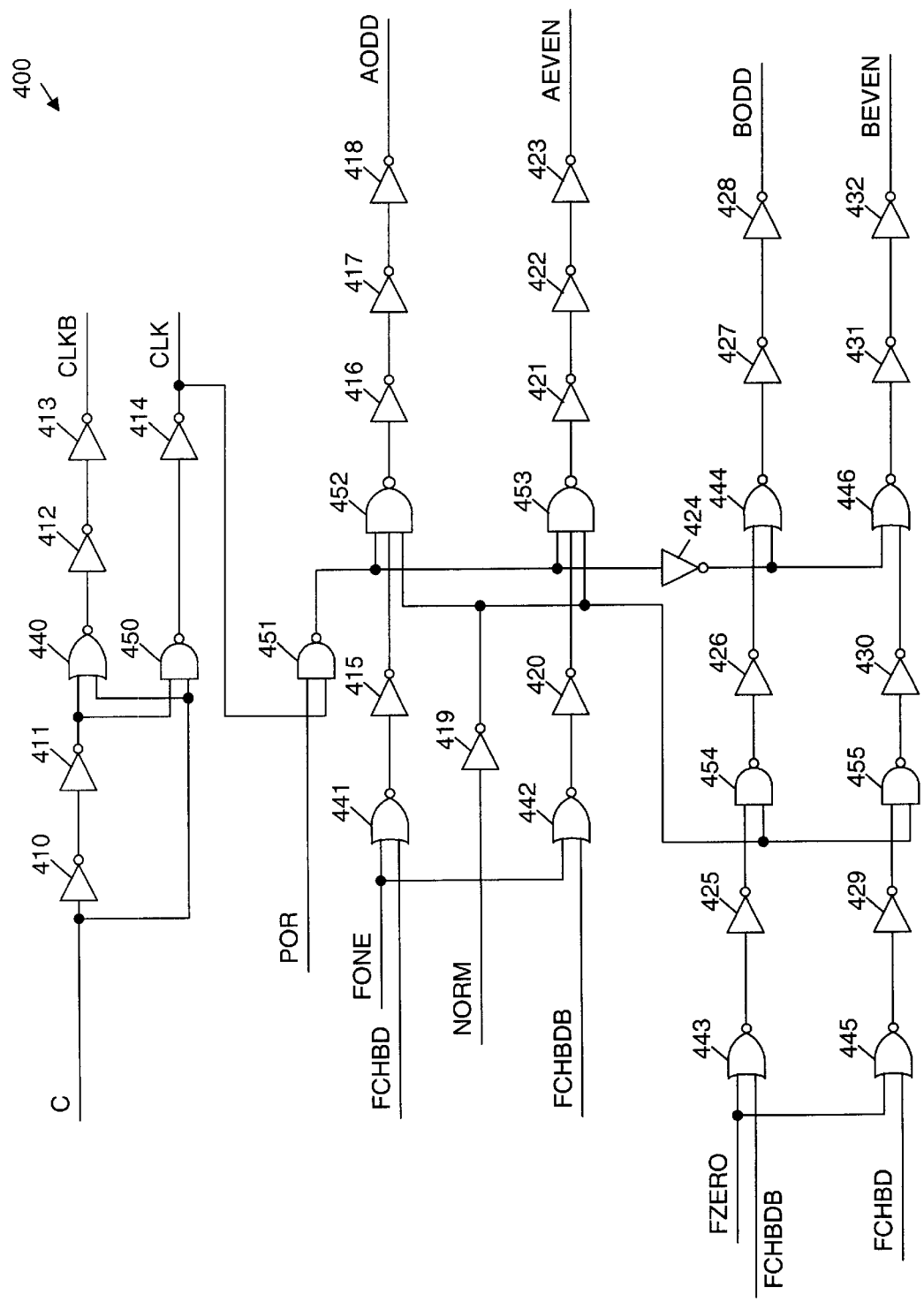
FIG. 4 is a schematic diagram of a logic generator in accordance with one embodiment of the present invention.

FIG. 4 is a schematic diagram of a logic generator 400 in accordance with an embodiment of the present invention. Logic generator 400 receives a clock signal C, a power-on reset signal POR, and the logic values of the test commands for commands FONE, FZERO, FCHBD, FCHBD, and NORM. The clock signal C is applied to a buffer formed from inverters 410 and 411, to a first input terminal of NOR gate 440 and a first input terminal of NAND gate 450. The buffered clock signal from inverter 411 is applied to a second input terminal of NOR gate 440 and a second input terminal of AND gate 450. The output signal from NOR gate 440 is buffered through inverters 412 and 413, and provided as inverse clock signal CLKB. The output signal from NAND gate 450 is inverted by inverter 414, provided as clock signal CLK, and applied to a first input terminal of NAND gate 451.

The power-on reset signal POR is applied to a second input terminal of NAND gate 451. When the clock signal CLK and the power-on reset signal POR have logic "1" values, all four data lines AODD, AEVEN, BODD, and BEVEN have logic "0" values, resetting all configurable latches within bitline shift register 210 (FIG. 2) to a logic "0" value. During normal operation and one-shot operation, the power-on reset signal POR has a logic "0" value, thereby providing a logic "1" value from the output terminal of NAND gate 415.

A NAND gate 452 has a first input terminal coupled to the output terminal of NAND gate 451, a second input terminal coupled to receive the inverse of command NORM (through inverter 419), and a third input terminal coupled to the logical OR of command FONE and FCHBD (through NOR gate 441 and inverter 415). The output signal of NAND gate 452 is buffered through inverters 416, 417, and 418, and provided on data line AODD.

A NAND gate 453 also has a first input terminal coupled to the output terminal of NAND gate 451 and a second input terminal coupled to receive the inverse of command NORM (through inverter 419), and has a third input terminal coupled to the logical OR of command FONE and FCHBDB (through NOR gate 442 and inverter 420). The output signal of NAND gate 453 is buffered through inverters 421, 422, and 423, and provided on data line AEVEN.

A NAND gate 454 has a first input terminal coupled to receive the logical OR of commands FZERO and FCHBDB (through NOR gate 443 and inverter 425) and a second input terminal coupled to receive the inverse of command NORM (through inverter 419). A NOR gate 444 has a first input terminal coupled to the output terminal of NAND gate 454 through inverter 426, and a second input terminal coupled to the output terminal of NAND gate 451 through inverter 424. The output signal of NOR gate 444 is buffered through inverters 427 and 428 and provided on data line BODD.

A NAND gate 455 has a first input terminal coupled to receive the logical OR of commands FZERO and FCHBD (through NOR gate 445 and inverter 429), and a second input terminal coupled to receive the inverse of command NORM (through inverter 419). A NOR gate 446 has a first input terminal coupled to the output terminal of NAND gate 455 through inverter 430, and a second input terminal coupled to the output terminal of NAND gate 451 through inverter 424. The output signal of NOR gate 446 is buffered through inverters 431 and 432 and provided on data line BEVEN.

Each command generates either a logic "1" value or a logic "0" value applied to data lines AEVEN, BEVEN, AODD, and BODD. For example, for a FCHBD command, a logic "0" value is applied to data lines AEVEN and BEVEN and a logic "1" value is applied to data lines AODD and BODD). Specifically, commands FONE, NORM, FCHBDB, and FZERO have logic "0" values and command FCHBD has a logic "1" value. The logic "0" value of power-on reset POR causes NAND gate 451 to provide a logic "1" value to the first input terminal of NAND ages 452 and 453, and a logic "0" value through inverter 424 to the second input terminals of NOR gates 444 and 446. The logic "0" value of command NORM causes inverter 419 to provide a logic "1" value to a second input terminal of NAND gates 452 and 453 and to a second input terminal of NAND gates 454 and 455.

The logic "1" value of command FCHBD causes inverter 415 to provide a logic "1" value to the third input terminal of NAND gate 452, which is buffered by inverters 416, 417, and 418 to apply a logic "1" value to data line AODD. The logic "0" values of commands FONE and FCHBDB cause inverter 420 to apply a logic "0" value to the third input terminal of NAND gate 453, which is buffered by inverters 421, 422, and 423 to a data line AEVEN. The logic "0" values of commands FZERO and FCHBDB cause a logic "0" value to be applied to a first input terminal of NAND gate 454, which causes a logic "0" value to be applied to a second input terminal of NOR gate 444. Thus, NOR gate 444, through inverters 427 and 428, applies a logic "1" value to data line BODD. The logic "1" value of FCHBD causes a logic "1" value to be applied to the second input terminal of NAND gate 455, which causes a logic "1" value to be applied to the second input terminal of NOR gate 446. Thus, NOR gate 446, through inverters 431 and 432, applies a logic "0" value to data line BEVEN. As described above, a logic "1" value applied to data lines AODD and BODD and a logic "0" value applied to data lines AEVEN and BEVEN causes a checkerboard pattern to be stored in bitline shift register 210 (FIG. 2).

In the various embodiments of this invention, novel structures and methods have been described to decrease the time required for testing memory arrays as well as to decrease the time required to load a bitline shift register. The various embodiments of the structures and methods of this invention that are described above are illustrative only of the principles of this invention and are not intended to limit the scope of the invention to the particular embodiments described. For example, in view of this disclosure, those skilled in the art can define other circuit elements that may be grouped together to function similarly to the embodiments described, such as other configurations of transistors, different sizes of memory arrays, other ways to generate logic "1" and "0" values, and so forth, and use these alternative features to create a method or system according to the principles of this invention. Thus, the invention is limited only by the following claims.

What is claimed is:

1. A memory system, comprising:
   a memory array;
   a bitline shift register including a plurality of storage latches coupled to the memory array; and
   structure for generating a plurality of data values in response to a control signal, for loading the plurality of data values into the plurality of storage latches of the bitline shift register in parallel, and for shifting the data values from the plurality of storage latches into the memory array in parallel.

2. The memory system of claim 1, wherein each storage latch includes:
   a first storage element;
   a one-shot circuit coupled to the first storage element for transmitting a data value from the structure to the first storage element; and
   a second storage element coupled to the first storage element.

3. The memory system of claim 2, wherein the one-shot circuit comprises:
   a set terminal coupled to the pull-up circuit; and
   a reset terminal coupled to the pull-down circuit.

4. The memory system of claim 1, wherein each storage element of the bitline shift register comprises:
   a pull-up circuit for pulling up the stored data value to a logic "1" value; and
   a pull-down circuit for pulling down the stored data value to a logic "0" value.

5. The memory system of claim 1, wherein the structure for generating comprises a logic generator configured to control the bitline shift register.

6. The memory system of claim 5, the logic generator applying control data values to be stored in the bitline shift register in parallel.

7. A memory system comprising:
   a memory array; and
   a bitline shift register coupled to the memory array,
   a structure for loading a plurality of data values into the bitline shift register in parallel and shifting the data values into the memory array in parallel,
   wherein the structure for generating comprises a logic generator configured to control the bitline shift register, and
   wherein the bitline shift register comprises a plurality of set lines, and the logic generator applies control data values to the plurality of set lines.

8. A memory system comprising:
   a memory array; and
   a bitline shift register coupled to the memory array, a structure for loading a plurality of data values into the bitline shift register in parallel and shifting the data values into the memory array in parallel,
   wherein the structure for generating comprises a logic generator configured to control the bitline shift register, and
   wherein the logic generator controls the bitline shift register to shift data values in series in normal operation.

9. A method of testing a memory array, the method comprising:
   controlling a logic generator to generate a test pattern for the memory test by transmitting an associated command signal to the logic generator;
   loading the test pattern in parallel from the logic generator to a bitline shift register; and
   storing the test pattern loaded in the bitline shift register in a first portion of the memory array.

10. The method of claim 9, wherein the parallel loading occurs in one clock cycle.

11. The method of claim 9, further comprising serially shifting normal operation data through the bitline shift register.

12. The method of claim 9, wherein the loading the bitline shift register includes applying a data value to a data line.

13. The method of claim 9, wherein the loading the bitline shift register includes asserting a set line of the shift register.

14. The method of claim 9, wherein the loading the bitline shift register includes asserting a reset line of the shift register.

15. The method of claim 9, wherein the loading the bitline shift register includes applying a plurality of control signals on a plurality of set lines.

16. The method of claim 15, wherein the loading the bitline shift register includes applying a plurality of control signals on a plurality of reset lines.

17. A system for testing a memory array, the system comprising:
- a bitline shift register including a plurality of storage latches coupled to the memory array;
- a logic generator for generating a test pattern for the memory test in response to a control signal;
- means for loading a bitline shift register with a row of the test pattern in parallel; and
- means for storing the test pattern row loaded in the bitline shift register in a first portion of the memory array.

18. The system of claim 17, wherein the means for loading in parallel loads the test pattern row in one clock cycle.

19. The system of claim 17, further comprising means for serially shifting normal operation data through the bitline shift register.

20. The system of claim 17, wherein the means for loading in parallel includes applying a data value to a data line.

21. The system of claim 17, wherein the means for loading in parallel includes means for asserting a set line of the shift register.

22. The system of claim 17, wherein the means for loading in parallel includes means for asserting a reset line of the shift register.

23. The system of claim 17, wherein the means for loading in parallel includes means for applying a plurality of control signals on a plurality of set lines.

24. A memory system, comprising:
- a memory array; and
- a biteline shift register coupled ot th e membory array; and structure for generating a pattern of data values in response to a control signal, and for programming the pattern of data values into the bitline shift register.

* * * * *